(12) United States Patent
Kim et al.

(10) Patent No.: US 8,716,093 B2
(45) Date of Patent: May 6, 2014

(54) METHODS OF MANUFACTURING A SEMICONDUCTOR DEVICE

(75) Inventors: Jin-Bum Kim, Seoul (KR);
Kwan-Heum Lee, Gyeonggi-do (KR);
Seung-Hun Lee, Seoul (KR);
Byeong-Chan Lee, Gyeonggi-do (KR);
Sun-Ghil Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/428,900

(22) Filed: Mar. 23, 2012

(65) Prior Publication Data
US 2012/0184079 A1   Jul. 19, 2012

Related U.S. Application Data

(62) Division of application No. 12/495,501, filed on Jun. 30, 2009, now abandoned.

(30) Foreign Application Priority Data

Jul. 2, 2008   (KR) .................................. 2008-64069

(51) Int. Cl.
*H01L 21/336* (2006.01)
*H01L 21/338* (2006.01)
*H01L 21/3205* (2006.01)
*H01L 21/4763* (2006.01)

(52) U.S. Cl.
USPC ........... 438/300; 438/299; 438/184; 438/303; 438/595

(58) Field of Classification Search
USPC ......... 438/300, 149, 231, 368, 197, 303, 301, 438/184, 366, 585, 595, 596, 229, 299
See application file for complete search history.

(56) References Cited

U.S. PATENT DOCUMENTS

| | | | | |
|---|---|---|---|---|
| 5,869,359 | A | * | 2/1999 | Prabhakar ..................... 438/149 |
| 6,165,826 | A |   | 12/2000 | Chau et al. |
| 6,287,924 | B1 | * | 9/2001 | Chao et al. ..................... 438/300 |
| 6,965,133 | B2 | * | 11/2005 | Geiss et al. ..................... 257/197 |
| 8,187,961 | B2 | * | 5/2012 | Doris et al. ..................... 438/585 |

FOREIGN PATENT DOCUMENTS

| | | |
|---|---|---|
| KR | 1020000056249 A | 9/2000 |
| KR | 1020040003897 A | 1/2004 |

* cited by examiner

*Primary Examiner* — Chuong A. Luu
(74) *Attorney, Agent, or Firm* — Myers Bigel Sibley & Sajovec, P.A.

(57) ABSTRACT

A semiconductor device can include a first gate electrode including a gate insulating pattern, a gate conductive pattern and a capping pattern that are sequentially stacked on a semiconductor substrate, and a first spacer of a low dielectric constant disposed on a lower sidewall of the first gate electrode. A second spacer of a high dielectric constant, that is greater than the low dielectric constant, is disposed on an upper sidewall of the first gate electrode above the first spacer.

14 Claims, 13 Drawing Sheets

US 8,716,093 B2

METHODS OF MANUFACTURING A SEMICONDUCTOR DEVICE

CROSS-REFERENCE TO RELATED APPLICATIONS

This application is a divisional of U.S. patent application Ser. No. 12/495,501 filed Jun. 30, 2009 in the United States Patent and Trademark Office, now abandoned, and claims priority under 35 U.S.C. §119 to Korean Patent Application No. 10-2008-0064069, filed on Jul. 2, 2008, the entire contents of which are hereby incorporated by reference.

BACKGROUND

As a size and a design rule of a semiconductor device are reduced, an integration of a semiconductor device is increased. As an integration of a semiconductor device is increased, increasing an operational speed of a semiconductor device becomes important. A typical method of increasing an operational speed of a semiconductor device can be to reduce parasitic capacitance which may exist in the semiconductor device. A parasitic capacitance may be generated in various portions of a semiconductor device. For example, a parasitic capacitance can be generated in a dielectric layer disposed between a gate electrode and a channel region of source/drain region, which may reduce the operational speed of the associated device.

SUMMARY

A semiconductor device can include a first gate electrode including a gate insulating pattern, a gate conductive pattern and a capping pattern that are sequentially stacked on a semiconductor substrate, and a first spacer of a low dielectric constant disposed on a lower sidewall of the first gate electrode. A second spacer of a high dielectric constant, that is greater than the low dielectric constant, is disposed on an upper sidewall of the first gate electrode above the first spacer.

Exemplary embodiments provide a method of manufacturing a semiconductor device. The method may include forming a first gate electrode including a gate insulating pattern and a gate conductive pattern that are sequentially stacked on a semiconductor substrate; forming a low dielectric constant layer on a sidewall of the first gate electrode; forming a first impurity junction region on the semiconductor substrate adjacent to a sidewall of the first gate electrode; forming a first spacer on a lower sidewall of the first gate electrode by patterning the low dielectric constant layer; forming a high dielectric constant layer on the semiconductor substrate; and forming a second spacer on an upper sidewall of the first gate electrode by patterning the high dielectric constant layer.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF THE EMBODIMENTS

Figure 1:
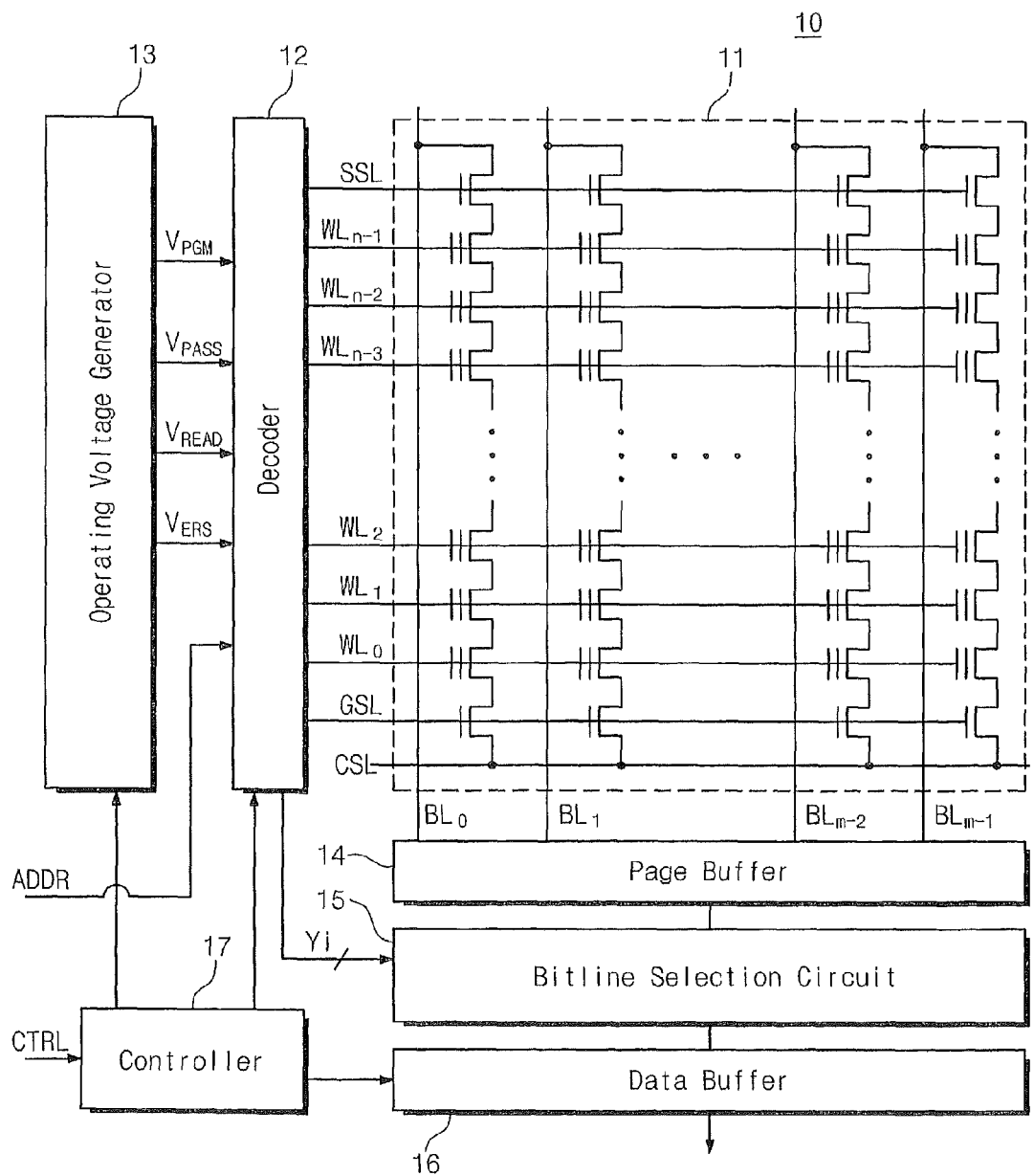
FIG. 1 is a view of a structure of a semiconductor device according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

FIG. 1 is a view of a structure of a semiconductor device according to embodiments of the present invention. Referring to FIG. 1, a semiconductor device 10 according to the present invention may include a memory cell array 11, a decoder 12, an operating voltage generating circuit 13, a page buffer 14, a bit line selection circuit 15, a data buffer 16 and a controller 17.

The memory cell array 11 may include a ground selection line (GSL), a string selection line (SSL) and a plurality of word lines ($WL_0$~$WL_{n-1}$) disposed on an active region of a semiconductor substrate (not shown). The word lines ($WL_0$~$WL_{n-1}$) may be disposed between the ground selection line (GSL) and the string selection line (SSL). Bit lines ($BL_0$~$BL_{m-1}$) crossing the word lines ($WL_0$~$WL_{n-1}$) may be disposed. The bit lines ($BL_0$~$BL_{m-1}$) may be connected to an active region of one side of the string selection line (SSL) and a common source line (CSL) parallel to the word lines ($WL_0$~$WL_{n-1}$) may be connected to an active region of one side of the ground selection line (GSL). The memory cell array 11 may include a plurality of memory blocks. Each of the memory blocks is comprised of a plurality of pages (for example, 32 pages or 64 pages). Each of the pages may be comprised of a plurality of memory cells (for example, 512 Byte or 2 k Byte) sharing one word line. In a case of a NAND flash memory, an erase operation may be performed by a memory block unit, and a read/write operation may be performed by a page unit.

The decoder 12 is connected to the memory cell array 11 through the word lines ($WL_0$~$WL_{n-1}$) and may be controlled by the controller 17. The decoder 12 may receive an address (ADDR) from a memory controller (not shown) and may generate a selection signal (Yi) so as to select a predetermined word line or a predetermined bit line.

The page buffer 14 is connected to the memory cell array 11 through the bit lines ($BL_0$~$BL_{m-1}$) and can store data loaded from the data buffer 16. The page buffer 14 loads data of an amount of one page and the loaded data may be simultaneously programmed to a selected page (for example, page 1) during a program operation. The page buffer 14 reads data from a selected page (for example, page 1) during a read operation and can temporarily store the read data. Data stored in the page buffer 14 may be transmitted to a memory controller (not shown) in response to a read enable signal (nRE not shown).

The bit line selection circuit 15 may select a bit line in response to the selection signal (Yi). The data buffer 16 may be an input/output buffer used in a data transmission between a memory controller (not shown) and the semiconductor device 10. The controller 17 may receive a control signal (CTRL) from a memory controller (not shown) and may control an internal operation of the semiconductor device 10. The operating voltage generator 13 may generate various voltages (for example, a program voltage ($V_{PGM}$), a pass voltage ($V_{PASS}$), a read voltage ($V_{READ}$) and an erase voltage ($V_{ERS}$)) used for an operation of the memory cell array 11 in response to a control of the controller 17.

Figure 2:
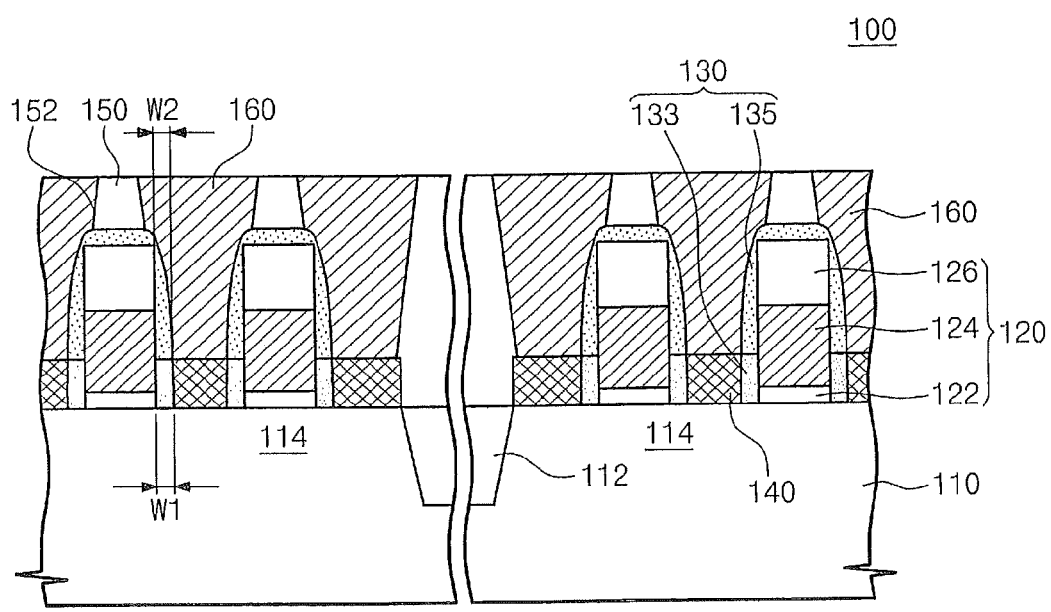
FIG. 2 is a view of a semiconductor device according to an embodiment of the present invention.

Hereinafter, a semiconductor device according to an embodiment of the present invention will be described in detail. FIG. 2 is a view of a semiconductor device according to an embodiment of the present invention.

Referring to FIG. 2, a semiconductor device 100 according to an embodiment of the present invention may include a substrate 110, a gate electrode 120, a spacer 130 and an impurity junction region 140.

The semiconductor substrate 110 may include an active region 114 defined by a device isolation layer 112. The semiconductor substrate 110 may be used as a seed layer to form the impurity junction region 140. For this reason, the semiconductor substrate 110 may include a bulk silicon substrate of a single crystalline. For example, the semiconductor substrate 110 may be a P-type semiconductor substrate into which a P-type impurity such as boron (B) is implanted.

The gate electrode 120 may include a gate insulating pattern 122, a gate conductive pattern 124 and a capping pattern 126 that are sequentially stacked on the active region 114. The gate insulating pattern 122 may be formed of any one material of a silicon oxide layer, a hafnium oxide layer, a hafnium silicate layer, a zirconium oxide layer, a zirconium silicate layer, an aluminum oxide layer and an aluminum silicate layer. The gate conductive pattern 124 may be formed of a conductive layer. For example, the gate conductive pattern 124 may be formed of any one material of a polysilicon layer, a metal layer (ex: a tungsten layer or a molybdenum layer), a conductive metal nitride layer (ex: a titanium nitride layer or a tantalum nitride layer) and a metal silicide layer (ex: a tungsten silicide layer or a cobalt silicide layer). The capping pattern 126 may be formed any one material of a nitride layer, a silicon nitride layer and a silicon oxynitride layer. The capping pattern 126 can prevent a damage of the gate conductive pattern 124 when a contact hole 152 for forming a contact plug 160 is formed.

The gate conductive pattern 124 may include a floating gate electrode pattern (not shown), a control gate electrode pattern (not shown) and an interlayer insulating pattern (not shown) interposed between the floating gate electrode pattern and the control gate electrode pattern. The control gate electrode pattern may include a polysilicon layer or a polycide layer having a polysilicon layer and a metal silicide layer.

The spacer 130 may be adjacently disposed on a sidewall of the gate electrode 120. For example, the spacer 130 may include a first spacer 133 and a second spacer 135 disposed above the first spacer 133. The first spacer 133 may be formed to cover a lower sidewall of the gate electrode 120 and the second spacer 135 may be formed to cover an upper sidewall of the gate electrode 120. The first spacer 133 may be formed to cover at least a portion of the gate insulating pattern 122 and the gate conductive pattern 124. The second spacer 135 may be formed to cover the rest of a sidewall of the gate electrode 120 except for the sidewall of the gate electrode 120 covered by the first spacer 133.

The first spacer 133 and the second spacer 135 may be formed of different materials. Also, the first spacer 133 may be formed of material having an etching rate lower than the gate electrode 120 and an interlayer insulating layer 150. For example, the first spacer 133 may be formed of any one material of an oxide layer and a silicon oxide layer, and the second spacer 135 may be formed of any one material of a nitride layer, a silicon nitride layer and a silicon oxynitride layer. The first spacer 133 is formed of material having a dielectric constant lower than the second spacer 135. As a result, the semiconductor device 100 may reduce or prevent parasitic capacitance from being generated on a dielectric layer between the gate electrode 110 and the impurity junction region 140.

A width (w1) of the first spacer 133 may be equal to or greater than a width (w2) of the second spacer. As a spacer between the gate electrodes becomes small, a parasitic capacitance may be generated on a dielectric layer (e.g., spacer) between the gate electrodes. The parasitic capacitance may be generated on a dielectric layer between the gate electrode and impurity regions used as a source/drain layer at both sides of the gate electrode. Therefore, the first spacer 133 may be formed of material having a low dielectric constant and a width (w1) of the first spacer 133 is formed to be sufficiently great, thereby preventing a parasitic capacitance from being generated on a side portion of the gate electrode 110.

The impurity junction region 140 may be formed on the active region 114 between the gate electrodes 120. The impurity junction region 140 may be formed by performing a selective epitaxial growth (SEG) process. When the selective epitaxial growth (SEG) growth is used, an epitaxial layer (that is, an impurity region 140) may be selectively formed on the active region 114 adjacent to the gate electrode 120. The epitaxial layer covers a lower sidewall of the first spacer 133. The epitaxial layer may be used as an elevated source/drain (ESD). The epitaxial layer may also be used as a source/drain pad so that the contact plug 160 penetrating the interlayer insulating layer 150 is connected to the elevated source/drain. The impurity junction region 140 may have a thickness that satisfies a device characteristic different from the semiconductor substrate 110 by forming the impurity junction region 140 using an epitaxial process.

The semiconductor device 100 may further include an impurity layer (not shown) in the active region of both sides of the gate electrode 120. The impurity layer may be formed by implanting dopant ions of high dose into the active region 114. Accordingly, an impurity layer of a high concentration may be disposed on a lower portion of the impurity junction region 140.

Figure 3A:
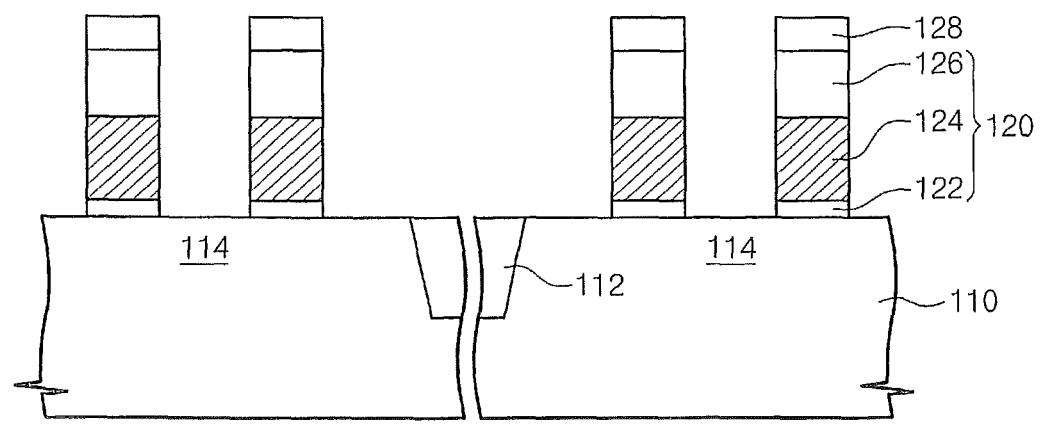
FIGS. 3A through 3F are views illustrating a process of manufacturing a semiconductor device.

A process of manufacturing a semiconductor device 100 according to the present invention described above will be described in detail. A detailed description of structures of the semiconductor device 100 described above may be omitted for brevity FIGS. 3A through 3F are views illustrating a process of manufacturing a semiconductor device. Referring to FIG. 3A, a gate electrode 120 is formed on an active region 114 defined by a device isolation layer 112. For example, a gate insulating layer, a gate conductive layer, a capping layer and a photoresist pattern 128 may be formed on the active region 114 of a semiconductor substrate 110. The capping layer, the gate conductive layer and the gate insulating layer may be sequentially patterned using the photoresist pattern 128 as an etching mask. As a result, the gate electrode 120 including a gate insulating pattern 122, a gate conductive pattern 124 and a capping pattern 126 that are sequentially stacked may be formed on the active region 114.

Figure 3B:
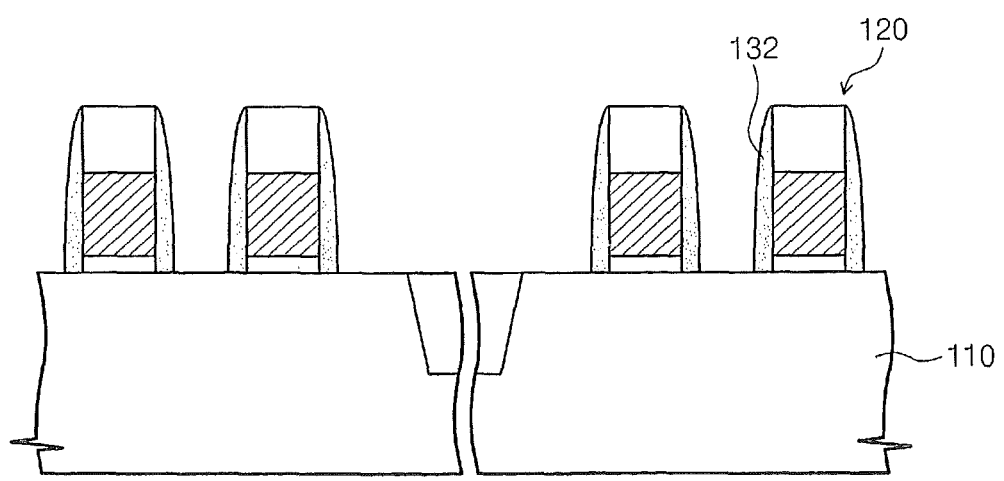

Referring to FIG. 3B, a preliminary first spacer 132 is formed on a sidewall of the gate electrode 120. For example, a preliminary spacer layer is conformally formed on an entire surface of the resultant structure including the gate electrode 120 and the preliminary spacer layer is anisotropically etched. Accordingly, the preliminary first spacer 132 covering a sidewall of the gate electrode 120 may be formed on the semiconductor substrate 110. The preliminary spacer layer may be formed of material having a low dielectric constant. The preliminary spacer layer may be formed of a silicon oxide layer.

Figure 3C:
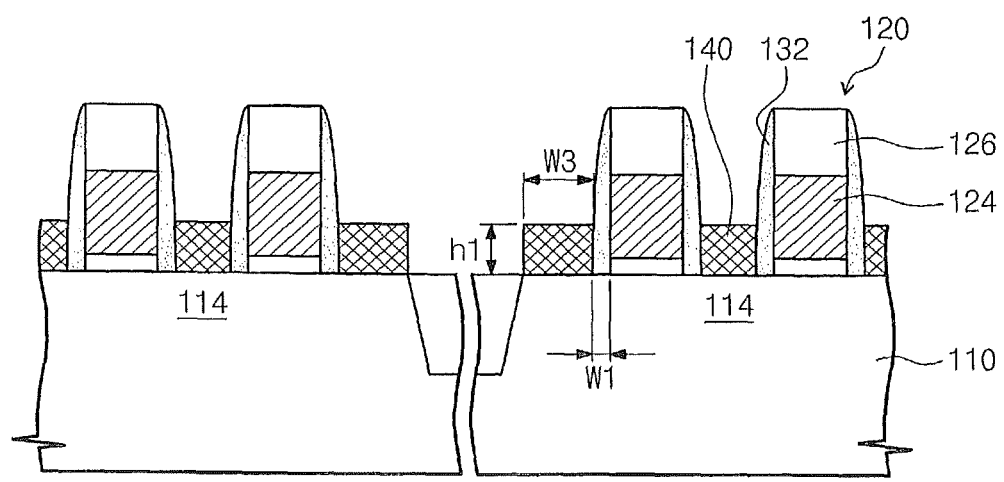

Referring to FIG. 3C, an impurity junction region 140 is formed on the active region 114 of an exposed semiconductor substrate 110. The impurity junction region 140 may be grown on the active region 114 adjacent to the gate electrode 120 by performing a selective epitaxial growth (SEG) process. Since the gate conductive pattern 124 is covered with the capping pattern 126, a growth of the impurity junction region 140 on the gate conductive pattern 124 may be prevented. In the selective epitaxial growth (SEG) process, a source material including a silicon or germanium is simultaneously or respectively provided to the semiconductor substrate 110 to form the impurity junction region 140. The impurity junction region 140 may be formed using any one technique of a solid phase epitaxy (SPE), a liquid phase epitaxy (LPE) and a vapor phase epitaxy (VPE). The impurity junction region 140 may be formed from the semiconductor substrate 110 using the semiconductor substrate 110 as a seed layer. As a result, the impurity junction region 140 may be used as an elevated source/drain (ESD) disposed higher than a top surface of the semiconductor substrate 110.

Here, a width (w1) of the impurity junction region 140 may be controlled by a width (w1) of the preliminary first spacer (132 of FIG. 3B). As the preliminary first spacer 132 is formed to be thick on a sidewall of the gate electrode 120, a width (w3) of the impurity junction region 140 may be reduced. Alternatively, as the preliminary first spacer 132 is formed to be thin on a sidewall of the gate electrode 120, a width (w3) of the impurity junction region 140 may be increased. A width (w1) of the preliminary first spacer 132 may be controlled so that a parasitic capacitance is not generated by the gate electrode 120 and the impurity junction region 140.

In the meantime, a method of manufacturing a semiconductor device may further comprise an impurity layer (not shown) formed on the active region 114 under the impurity junction region 140. The impurity layer may be formed by implanting dopant ions of high dose into the semiconductor substrate 110 using the gate electrode 120 and the preliminary first spacer 132 as a mask. As a result, the impurity junction region 140 may be formed to be an impurity region of low concentration and the impurity layer may be formed to be an impurity region of high concentration.

Figure 3D:
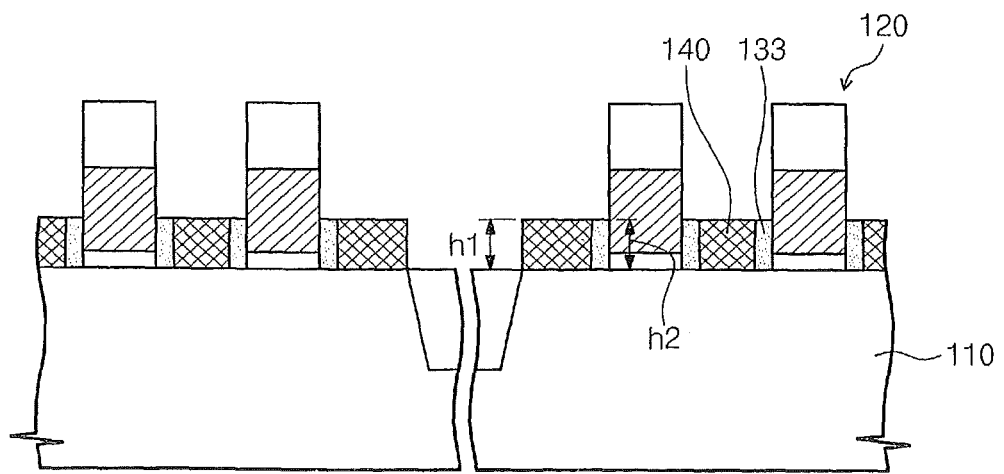

Referring to FIG. 3D, a first spacer 133 covering a lower sidewall of the gate electrode 120 is formed. The first spacer 133 may be formed by selectively etching an exposed portion of the preliminary first spacer 132. For example, the first spacer 133 may be formed by etching an entire surface of the semiconductor substrate 110 using the impurity junction region 140 as an etch stop layer. The etching process may have an etching recipe having an etching selectivity with respect to the preliminary first spacer 132. Since the first spacer 133 is formed by performing an etching process using the impurity junction region 140 as etching stop layer, a height (h1) of the impurity junction region 140 may be substantially equal to a height (h2) of the first spacer 133. When the preliminary first spacer 132 is overetched, the height (h2) of the first spacer 133 may be lower than the height (h1) of the impurity junction region 140.

The first spacer 133 may prevent a parasitic capacitance from being generated between the gate electrode 120 and the impurity junction region 140. For instance, the first spacer 133 is formed of a material having a low dielectric constant to prevent a generation of a parasitic capacitance between the gate electrode 120 and the impurity junction region 140. Also, a width of the first spacer 133 is formed to be sufficiently thick to prevent the generation of the parasitic capacitance.

Figure 3E:
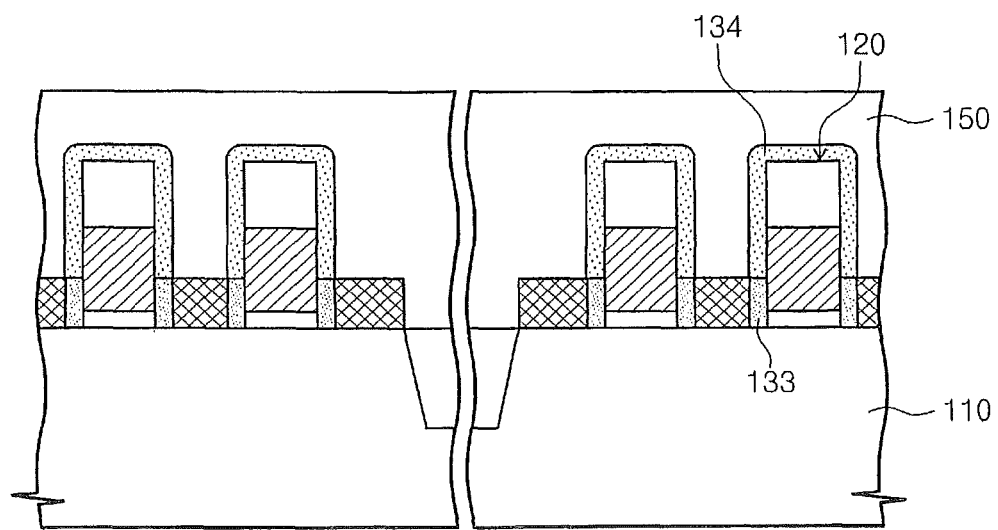

Referring to FIG. 3E, a second spacer formation layer 134 may be conformally formed on an entire surface of the semiconductor substrate 110. The second spacer formation layer 134 may be formed of material having a dielectric constant lower than the first spacer 133. For example, the second spacer formation layer 134 may include a nitride layer. After that, an interlayer insulating layer 150 may be formed on an entire surface of the semiconductor substrate 110. The interlayer insulating layer 150 may be formed of material having an etching selectivity with respect to the first spacer 133 and the second spacer formation layer 134.

Figure 3F:
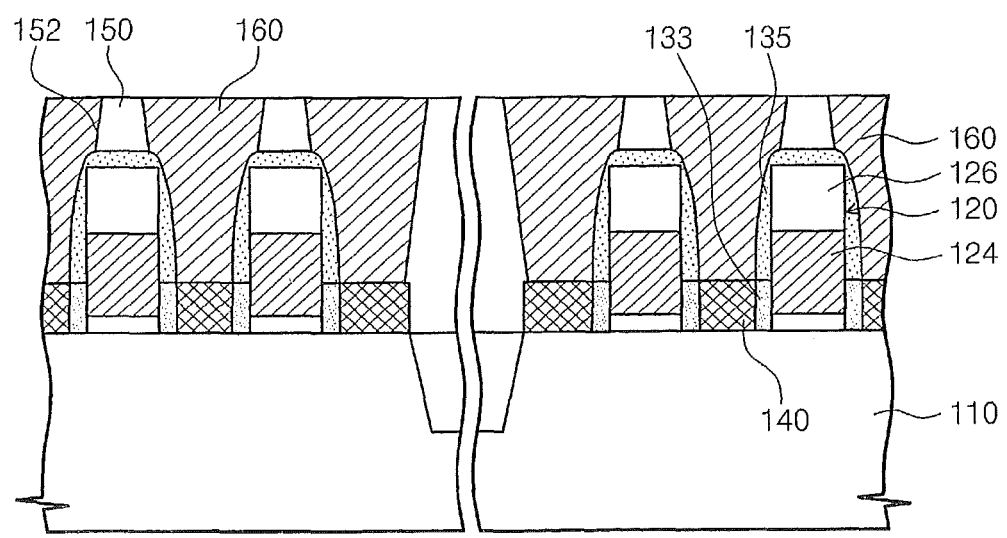

Referring to FIG. 3F, a contact plug 160 electrically connected to the impurity junction region 140 is formed. For example, a contact hole 152 exposing the impurity junction region 140 may be formed. At this time, a portion of the second spacer formation layer (134 of FIG. 3E) is etched to form a second spacer 135 covering an upper sidewall and a top surface of the gate electrode 120. The contact hole 152 may be self-aligned by the second spacer 135. A portion of the second spacer formation layer 134 covering a top surface of the gate electrode 120 may prevent a damage of the gate electrode 120 during a formation of the self-alignment contact hole 152.

After forming a conductive layer filling the contact hole 152, the conductive layer is planarized using the interlayer insulating layer 150 as an etching stop layer to form the contact plug 160. The contact plug 160 may be electrically connected to an interconnection (not shown) formed on the interlayer insulating layer 150 during a subsequent process. The interconnection may include a storage node line of a capacitor and a bit line.

As described above, when the contact hole 152 is formed to be self-aligned, the second spacer formation layer 134 formed on a top surface of the gate electrode 120 and the capping pattern 126 of the gate electrode 120 may function as a means preventing a damage of the gate conductive pattern 124. That is, since the second spacer formation layer 134 and the capping pattern 126 are formed of material having an etching rate lower than the gate conductive pattern 124, they can prevent a damage of the interlayer insulating layer 150 during a formation of the contact hole 152.

Also, the first spacer 133 having a low dielectric constant is disposed on a lower sidewall of the gate electrode 120 to prevent a generation of a parasitic capacitance due to the gate electrode 120 and the impurity junction region 140. Particularly, the present invention prevents a generation of a parasitic capacitance on a dielectric layer between the impurity junction region 140 and the gate electrode 120 which are formed through a selective epitaxial growth process and disposed higher than a surface of the semiconductor substrate 110.

Figure 4A:
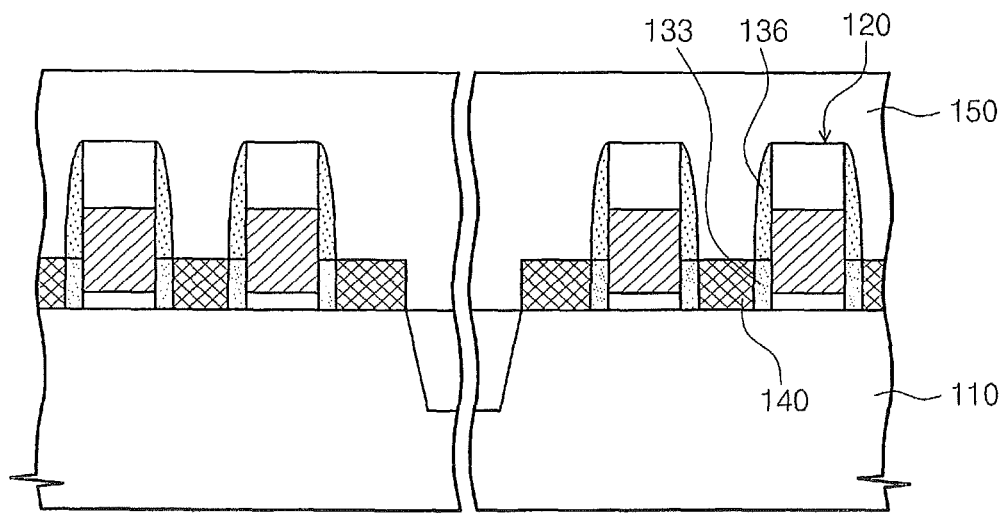
FIGS. 4A and 4B are views illustrating a method of manufacturing a semiconductor device according to a modified embodiment of a semiconductor device depicted in FIG. 2.
Figure 4B:
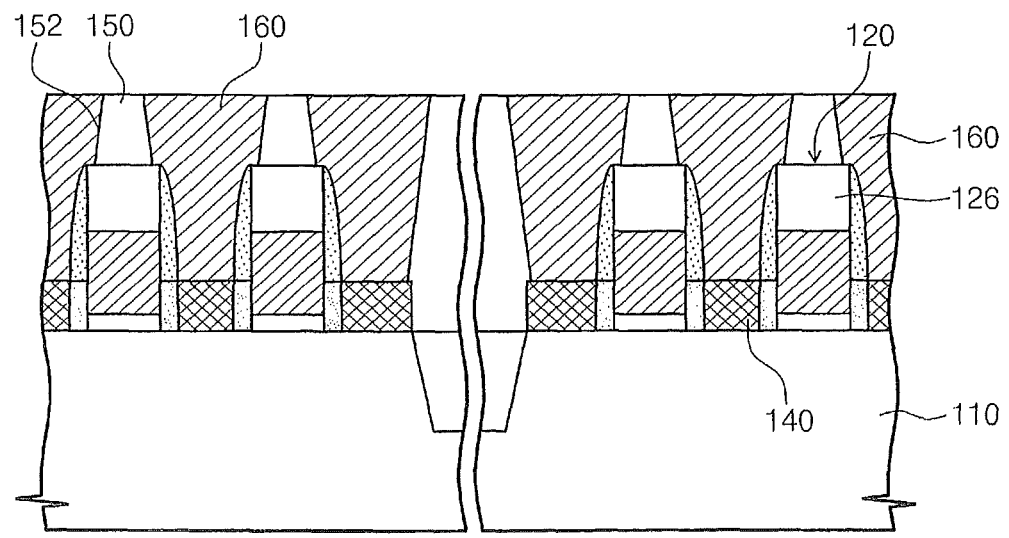

FIGS. 4A and 4B are views illustrating a method of manufacturing a semiconductor device according to a modified embodiment of a semiconductor device depicted in FIG. 2.

Referring to FIG. 4A, an entire surface of a semiconductor device including the second spacer formation layer 134 depicted in FIG. 3E is anisotropically etched to form a second spacer 136 surrounding an upper sidewall of the gate electrode 120 on a top surface of the first spacer 133. Thus, the second spacer formation layer 135 may not remain on a top surface of the gate electrode 120. An interlayer insulating layer 150 is formed on an entire surface of the semiconductor substrate 110.

Referring to FIG. 4B, a contact plug 160 electrically connected to the impurity junction region 140 is formed. The contact plug 160 may be formed using a method similar to the method of forming the contact plug 160 described referring to FIG. 3F. For instance, a contact hole 152 exposing the impurity junction region 140 is formed on the interlayer insulating layer 150. At this time, the gate electrode 120 may be protected by the capping pattern 126 during a formation of the contact hole 152. After forming a conductive layer filling the contact hole 152, the conductive layer is planarized using the interlayer insulating layer 150 as an etching stop layer to form the contact plug 160.

Hereinafter, a process of manufacturing a semiconductor device according to another embodiment of the present invention will be described in detail. The description of common features already discussed above will be omitted for brevity.

Figure 5:
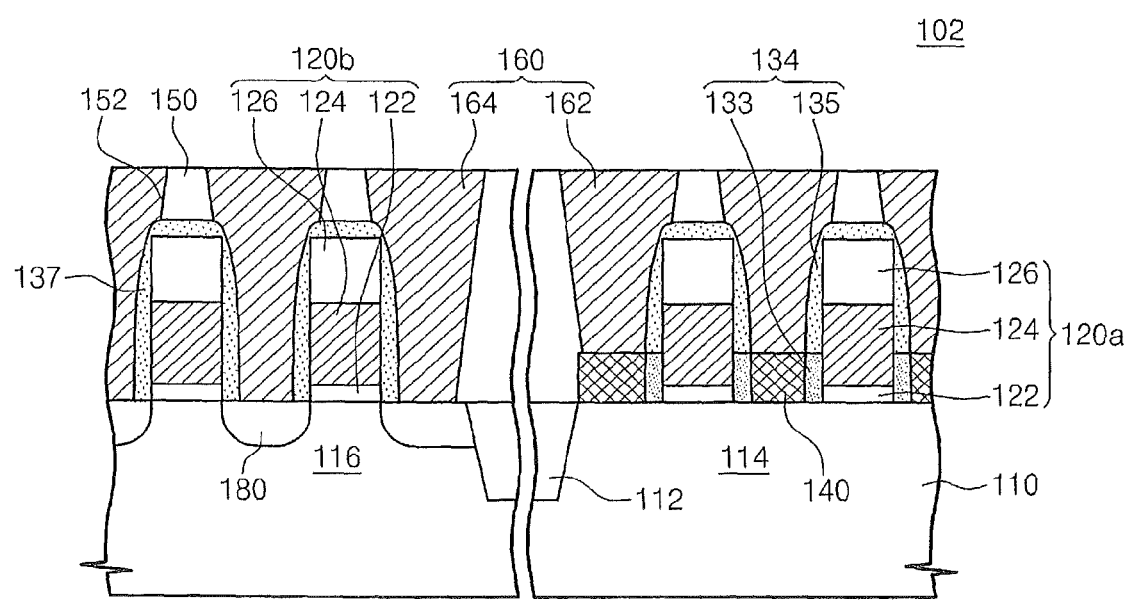
FIG. 5 is a view of a semiconductor device according to another embodiment of the present invention.

FIG. 5 is a view of a semiconductor device according to another embodiment of the present. Referring to FIG. 5, a semiconductor device 102 according to another embodiment of the present invention may include first and second gate electrodes 120a and 120b, first through third spacers 133, 135 and 137, and a first impurity junction region 140 selectively formed in an active region adjacent to the first gate electrode 120a.

The semiconductor substrate 110 may include a first active region 114 and a second active region 116 defined by a device isolation layer 112. In one embodiment, the first and second active regions 114 and 116 may be regions in which cell array transistor are formed. In another embodiment, the first active region 114 may be a region in which cell array transistors are formed and the second active region 116 may be a region in which circuit transistors for operating the cell array transistors are formed.

The first and second gate electrodes 120a and 120b may be formed on the first active region 114 and the second region 116, respectively. The first and second gate electrodes 120a and 120b may include a gate insulating pattern 122, a gate conductive pattern 124 and a capping pattern 126 that are sequentially stacked on the first and second active regions 114 and 116, respectively.

The first spacer 133 may be selectively formed only on the first active region 114. The first spacer 133 may be formed to cover a lower sidewall of the first gate electrode 120a. The second spacer 135 may be formed to cover an upper sidewall of the first gate electrode 120a. The third spacer 137 may be formed to cover an entire sidewall of the second gate electrode 120*b*. Accordingly, a lower sidewall of the first gate electrode 120*a* may be covered with the first spacer 133 and an upper sidewall of the first gate electrode 120*a* may be covered with the second spacer 135. An entire sidewall of the second gate electrode 120*b* may be covered with the third spacer 137.

The first spacer 133 and the second spacer 135 may be formed of materials different from each other. The second spacer 135 and the third spacer 137 may be formed of the same material. As described in an embodiment, the first spacer 133 may be formed of material having a dielectric constant lower than the second spacer 135. For example, the first spacer 133 may be formed of any one material of an oxide layer and a silicon oxide layer, and the second spacer 135 may be formed of any one material of a nitride layer, a silicon nitride layer and a silicon oxynitride layer.

The impurity junction region 140 (hereinafter, it is referred to as a first impurity region) may be disposed only on the first active region 114. Since the first impurity region 140 is grown from the semiconductor substrate 110 using the semiconductor substrate 110 as a seed layer, it may be disposed to be higher than a surface of the semiconductor substrate 110.

The semiconductor device 102 may further include an impurity layer 180 (hereinafter, it is referred to as a second impurity region) formed in the semiconductor substrate 110 adjacent to the second gate electrodes 120*b*. The second impurity junction region 180 may be formed by implanting dopant ions of high dose into second active region 116 of the semiconductor substrate 110. Thus, the second impurity junction region 180 having a top surface even with a surface of the semiconductor substrate 110 may be formed in the second active region 116.

The semiconductor device 102 may further include a contact plug 160. The contact plug 160 may include a first plug 162 formed on the first active region 114 and a second plug 164 formed on the second active region 116. The first plug 162 is formed to penetrate an interlayer insulating layer 150 and may be electrically connected to the first impurity junction region 140 formed on the first active region 114 of both sides of the first gate electrode 120*a*. The second plug 164 is formed to penetrate an interlayer insulating layer 150 and may be electrically connected to the second impurity junction region 180 formed on the second active region 116 of both sides of the second gate electrode 120*b*.

Subsequently, a process of manufacturing a semiconductor device 102 according to another embodiment of the present invention will be described in detail. Here, like reference numerals refer to like elements of the semiconductor device 100 according to an embodiment of the present invention. The description of common features already discussed in the semiconductor device 100 according to an embodiment will be omitted for brevity.

FIGS. 6A through 6F are views illustrating a process of manufacturing a semiconductor device according to another embodiment of the present invention.

Figure 6A:
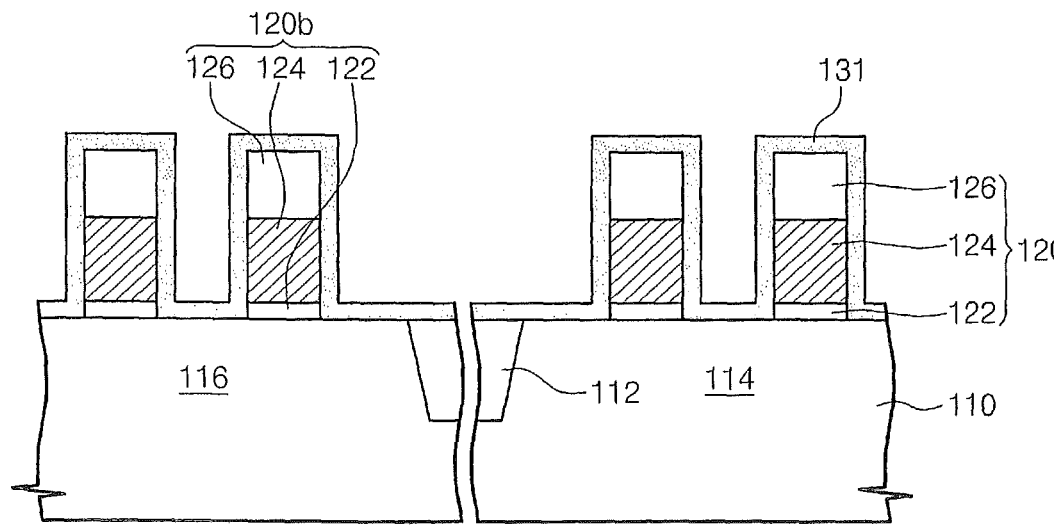
FIGS. 6A through 6F are views illustrating a process of manufacturing a semiconductor device according to another embodiment of the present invention.

Referring to FIG. 6A, first and second gate electrodes 120*a* and 120*b* are formed on a semiconductor substrate 110. For example, a gate insulating layer, a gate conductive layer, a capping layer and a photoresist pattern are sequentially formed on first and second active regions 114 and 116 defined by a device isolation layer 112. After a trench exposing the first and second active regions 114 and 116 is formed using the photoresist pattern as a mask, the photoresist pattern may be removed. As a result, first and second gate electrodes 120*a* and 120*b* including a gate insulating pattern 122, a gate conductive pattern 124 and a capping pattern 126 that are sequentially stacked may be formed on the first and second active regions 114 and 116, respectively. A preliminary first spacer formation layer 131 may be conformally formed on an entire surface of a resultant structure including the first and second gate electrodes 120*a* and 120*b*. The preliminary first spacer formation layer 131 may be formed of material having a low dielectric constant. For example, the preliminary first spacer formation layer 131 may be formed of material including an oxide layer.

Figure 6B:
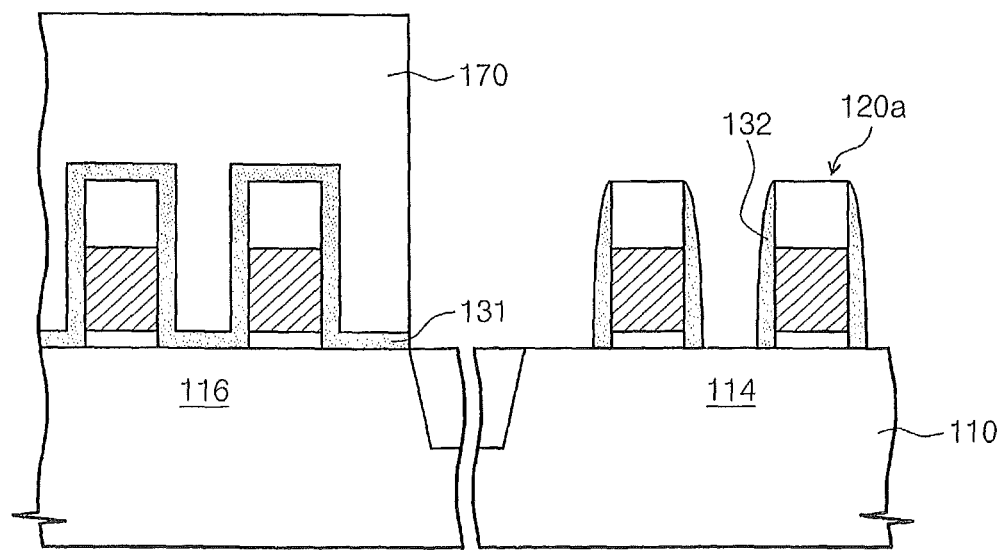

Referring to FIG. 6B, a photoresist layer covering an entire surface of the first active region 114 and the second active region 116 is formed and a photoresist layer on the first active region 114 is selectively removed. Accordingly, a photoresist pattern 170 is formed only on the second active region 116.

A preliminary first spacer 132 is formed on a sidewall of the first gate electrode 120*a*. For example, an entire surface of the semiconductor substrate 110 on which the photoresist pattern 170 may be anisotropically etched. At this time, the second active region 116 may not be etched by the photoresist pattern 170. The preliminary first spacer formation layer (131 of FIG. 6A) on the first active region 114 is anisotropically etched, so that a preliminary first spacer 132 surrounding a sidewall of the first gate electrode 120*a* may be formed on the first active region 114.

Figure 6C:
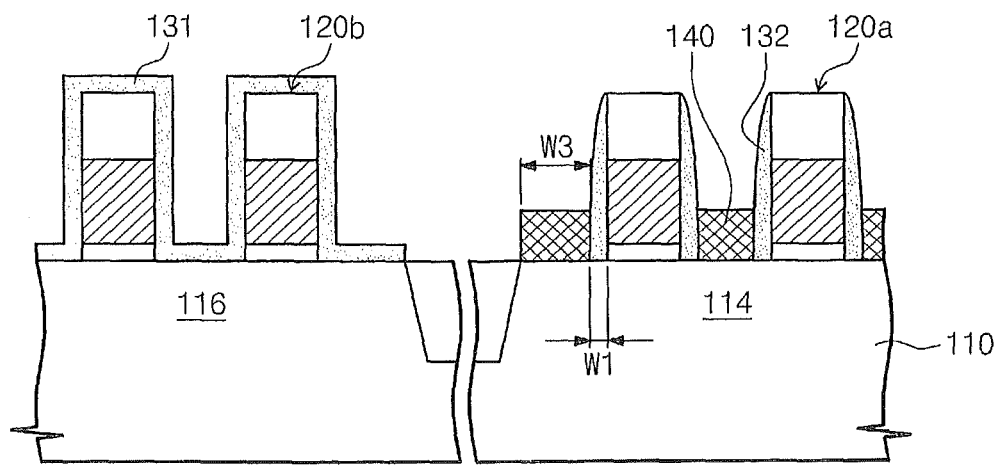

Referring to FIG. 6C, the photoresist pattern (170 of FIG. 6B) on the second active region 116 is removed. A first impurity junction region 140 is formed on the first active region 114. The first impurity junction region 140 may be formed by performing a selective epitaxial growth process. The selective epitaxial growth process may be a process that grows an impurity layer on the first active region 114 using the semiconductor substrate 110 as a seed layer. Since the second active region 116 is protected by the preliminary first spacer formation layer 131, the first impurity junction region 140 may be selectively formed only on the first active region 114. Thus, the first impurity junction region 140, which is disposed to be higher than a surface of the semiconductor substrate 110 and used as an elevated source/drain, may be formed on the first active region 114 adjacent to the first gate electrode 120*a*.

Here, a width (w3) of the impurity junction region 140 may be controlled by a width (w1) of the preliminary first spacer 132. For instance, as the preliminary first spacer 132 is formed to be thick on a sidewall of the first gate electrode 120*a*, the width (w3) of the impurity junction region 140 may be reduced. Alternatively, as the preliminary first spacer 132 is formed to be thin on a sidewall of the first gate electrode 120*a*, the width (w3) of the impurity junction region 140 may be increased. The width (w3) of the impurity junction region 140 may be controlled so that a parasitic capacitance is not generated by the first gate electrode 120*a* and the impurity junction region 140.

Figure 6D:
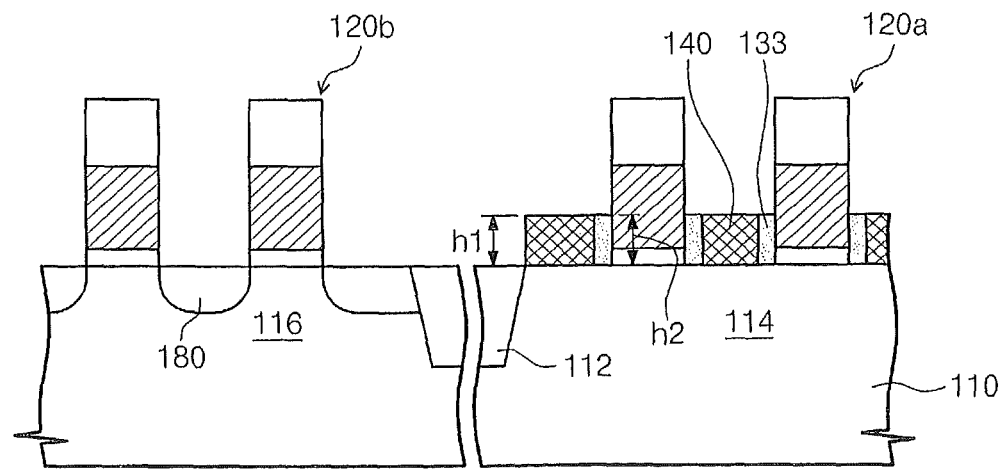

Referring to FIG. 6D, a portion of the preliminary first spacer 132 is removed to form a first spacer 133 and the preliminary first spacer formation layer 131 on the second active region 116 may be simultaneously removed. The first spacer 133 may be formed by selectively etching an exposed portion of the preliminary first spacer 132. For example, the first spacer 133 may be formed by etching an entire surface of the semiconductor substrate 110 using the impurity junction region 140 as an etching stop layer. The etching process may include an etching recipe having an etching selectivity with respect to the preliminary first spacer 132. The preliminary first spacer formation layer 131 on the second active region 116 may be removed in the process of performing the etching process. Since the first spacer 133 is formed by performing an etching process using the impurity junction region 140 as an etching stop layer, a height (h1) of a top surface of the first impurity junction region 140 may be substantially even with a height (h2) of a top surface of the first spacer 133. When the first spacer 133 is overetched, the height (h1) of a top surface of the first impurity junction region 140 may be lower than the height (h2) of a top surface of the first spacer 133.

The first spacer 133 may prevent a parasitic capacitance from being generated between the first gate electrode 120a and the first impurity junction region 140. The first spacer 133 may be formed of material having a low dielectric constant. In addition, a width (w1) of the first spacer 133 may be formed to be a sufficiently thick. Thus, the semiconductor device 102 may prevent a parasitic capacitance from being generated between the first gate electrode 120a and the first impurity junction region 140.

A second impurity junction region 180 may be formed on the second active region 116. The second impurity junction region 180 may be formed by implanting dopant ions of high dose into the second active region 116 adjacent to the second gate electrode 120b. As a result, the second impurity junction region 180 having a height of a top surface even with a surface of the semiconductor substrate 110 may be formed in the second active region 116.

Figure 6E:
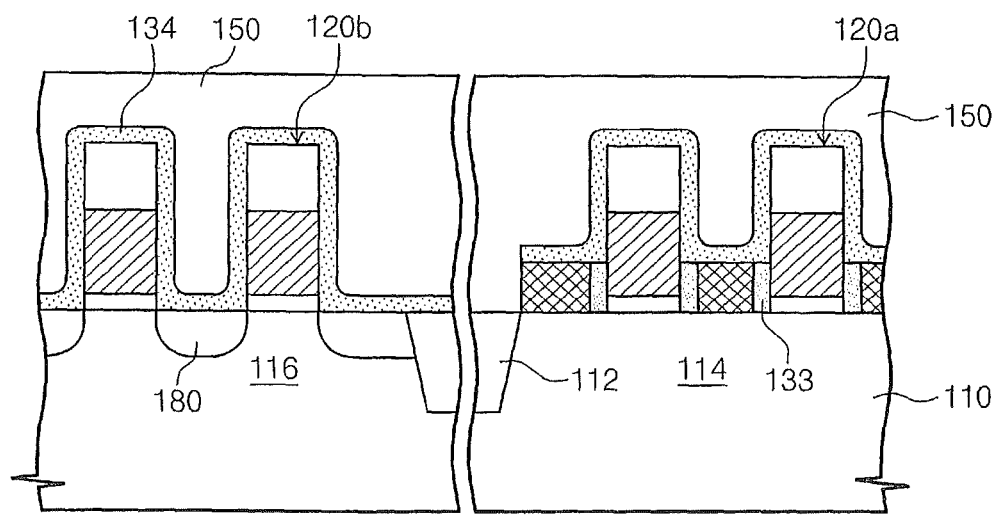

Referring to FIG. 6E, a second spacer formation layer 134 is conformally formed on an entire surface of the semiconductor substrate 110. The second spacer formation layer 134 may be formed of material having a dielectric constant higher than the first spacer 133. The second spacer formation layer 134 may be formed of material having a nitride layer.

Figure 6F:
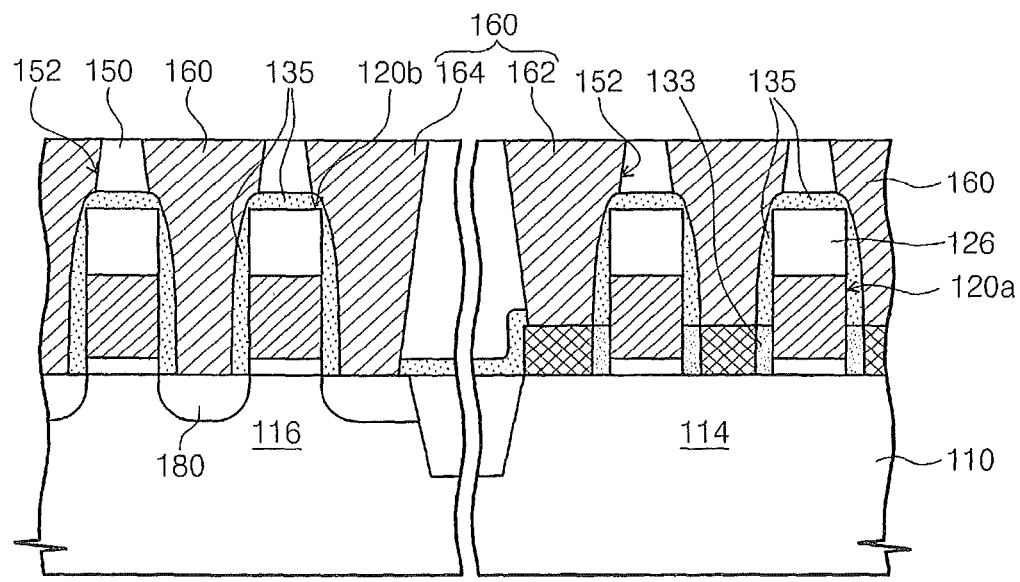

Referring to FIG. 6F, after an interlayer insulating layer 150 is formed on an entire surface of the semiconductor substrate 110, the interlayer insulating layer 150 is planarized. A contact hole 152 exposing the first impurity junction region 140 adjacent to the first gate electrode 120a and the second active region 116 adjacent to the second gate electrode 120b may be formed. The contact hole 152 may be self aligned by the second spacer formation layer (134 of FIG. 6E). As a result, a portion of the second spacer formation layer 134 is etched to form a second spacer 135. The second spacer 135 may cover a top surface and an upper sidewall of the first gate electrode 120a on the first active region 114, and may cover a top surface and an entire portion of sidewall of the second gate electrode 120b on the second active region 116.

A plug 160 filling the contact hole 152 is formed. For instance, after the contact hole 152 is filled with a conductive material, the conductive material may be planarized using the interlayer insulating layer 150 as an etching stop layer. As a result, a first plug 162 electrically connected to the first impurity junction region 140 may be formed on the first active region 114. Also, a second plug 164 electrically connected to the second impurity junction region 180 formed in the second active region 116 adjacent to the second gate electrode 120b may be formed on the second active region 116.

As described above, unlike the semiconductor device 100 according to the present invention, the semiconductor device 102 according to another embodiment of the present invention may have a structure that the first gate electrode 120a covered with the first and second spacers 133 and 135 having different materials and the first impurity junction region 140 are selectively formed in different active regions of the semiconductor substrate 110.

Figure 7A:
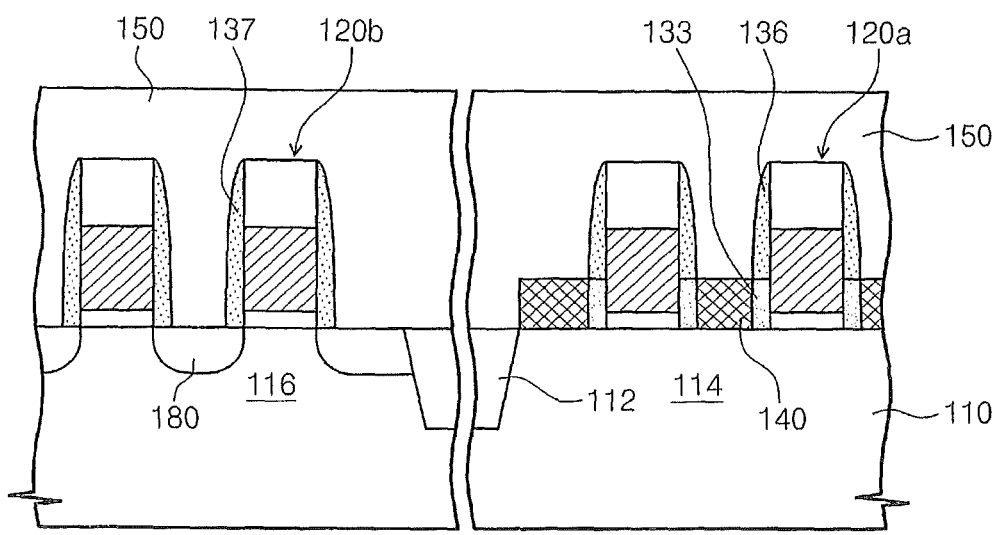
FIGS. 7A and 7B are views illustrating a process of manufacturing a semiconductor device according to a modified embodiment of a semiconductor device depicted in FIG. 5.
Figure 7B:
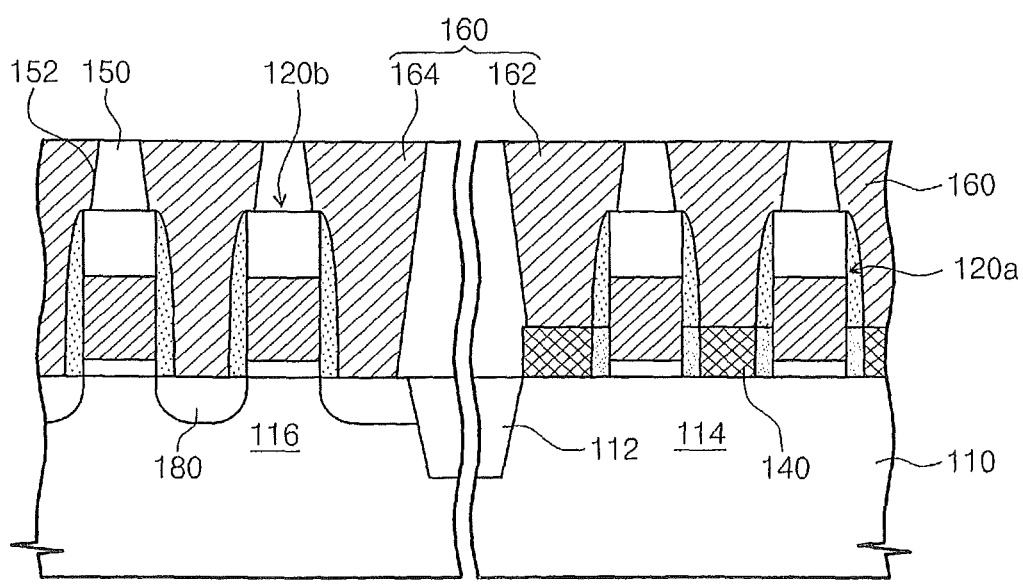

FIGS. 7A and 7B are views illustrating a process of manufacturing for semiconductor device according to a modified embodiment of a semiconductor device depicted in FIG. 6.

Referring to FIG. 7A, the second spacer formation layer 134 on the semiconductor substrate 110 depicted in FIG. 6E is anisotropically etched. As a result, a second spacer 136 covering an upper sidewall of the first gate electrode 120a may be formed on the first active region 114 and a third spacer 137 covering an entire portion of the sidewall of the second gate electrode 120b may be formed on the second active region 116. The second spacer formation layer 134 may not remain on a top surface of the first gate electrode 120a. An interlayer insulating layer 150 is formed on an entire surface of the semiconductor substrate 110.

Referring to FIG. 7B, a contact plug 160 electrically connected to an impurity junction region 140 is formed. The contact plug 160 may be formed through a method similar to the method of forming the contact plug 160 described referring to FIG. 6F. That is, the contact plug 160 may be formed by sequentially performing a step of forming a conductive layer filling the contact hole 152 and a step of planarizing the conductive layer using the interlayer insulating layer 150 as an etching stop layer. At this time, while the contact hole 152 is formed, the gate electrode 120 may be protected by the capping pattern 126. Thus, a first plug 162 connected to the first impurity junction region 140 and a second plug 164 connected to the second impurity junction region 180 may be formed.

Figure 8:
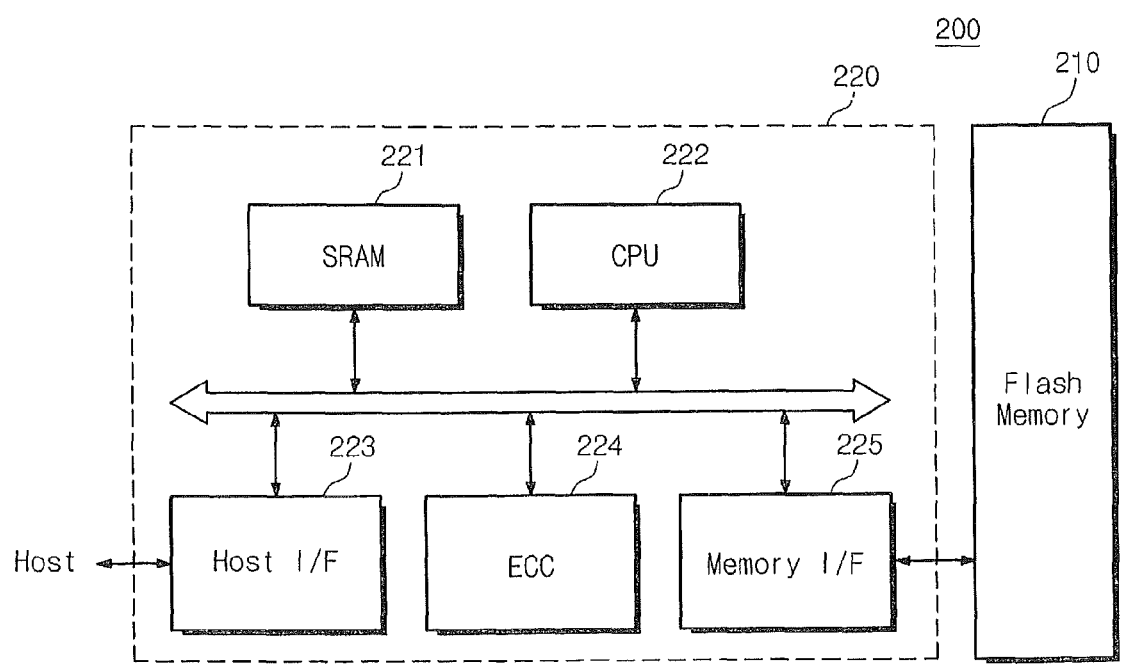
FIG. 8 is a block diagram of a memory card including a semiconductor device according to the present invention.

FIG. 8 is a block diagram of a memory card including a semiconductor device according to the present invention. The semiconductor device may be a flash memory device. Referring to FIG. 8, a memory card 200 for supporting a capability of storing a huge amount of data is fitted with a flash memory device 210 according to the present invention. The memory card 200 according to the present invention includes a memory controller 220 controlling data exchange between a host interface 223 and the flash memory device 210.

A SRAM 221 may be used as an operating memory of a central processing unit 222 (CPU). The host interface 223 may include a data exchange protocol connected to the memory card 200. An error correction code 224 detects and corrects errors included in data read from the flash memory device 210. A memory interface 225 interfaces with the flash memory device of the present invention. The central processing unit 222 (CPU) performs every control operation for data exchange of the memory controller 220. The memory card 200 according to the present invention may further include a ROM (not shown) storing code data for interfacing with the host interface 223. In particular, the flash memory device of the present invention may be provided to a memory system such as a solid state disk (SSD).

Figure 9:
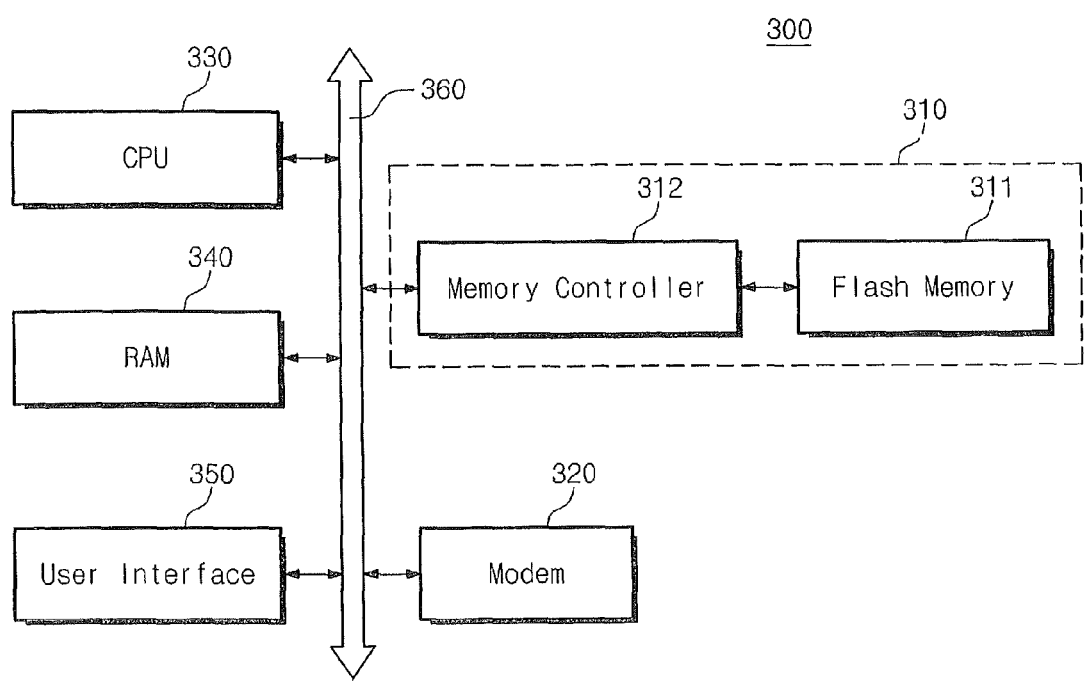
FIG. 9 is a block diagram of a data processing system with a built-in semiconductor device according to the present invention.

FIG. 9 is a block diagram of a data processing system with a built-in semiconductor device according to the present invention. The semiconductor device may be a flash memory system 310. Referring to FIG. 9, the flash memory system 310 may be fitted with a data processing system such as a mobile device or a desk top computer. The flash memory system 310 may include a flash memory device 311 and a memory controller 312 controlling the flash memory device 311.

A data processing system 300 according to the present invention may include the flash memory system 310, and a modem 320, a central processing unit 330, a RAM 340 and a user interface 350 which are electrically connected to a system bus 360, respectively. The flash memory system 310 may be constituted to be identical to the flash memory device described above. Data processed by the central processing unit 330 or data inputted from the outside may be stored in the flash memory system 310. The flash memory system 310 may be comprised of a solid state disk (SSD) and in this case, the data processing system 300 may stably store a huge amount of data in the flash memory system 310. As reliability increases, the flash memory system 310 reduces resources needed to an error correction to provide a data exchange function of high speed to the data processing system 300. An application chipset, a camera image processor (CIS) and an input/output device may be further provided to the data processing system 300.

A semiconductor device according to the present invention may be mounted on packages of various types. For example, a semiconductor device according to the present invention, for example a flash memory device or a memory system, may be packaged in a manner such as package on package, ball grid array, chip scale package, plastic leaded chip carrier, plastic dual in-line package, die in waffle pack, die in wafer form, chip on board, ceramic dual in-line package, plastic metric quad flat pack, thin quad flat pack, small outline, shrink small outline package, thin small outline, thin quad flatpack, system in package, multi chip package, wafer-level fabricated package, wafer-level processed stack package.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein

What is claimed is:

1. A method of manufacturing a semiconductor device comprising:
    forming a first gate electrode including a gate insulating pattern and a gate conductive pattern that are sequentially stacked on a semiconductor substrate;
    forming a low dielectric constant layer on a sidewall of the first gate electrode;
    forming a first impurity junction region on the semiconductor substrate adjacent to a sidewall of the first gate electrode;
    forming a first spacer on a lower sidewall of the first gate electrode by etching the low dielectric constant layer using the first impurity junction region as an etch stop layer to remove a portion of the low dielectric constant layer to expose an upper part of the sidewall of the first gate electrode;
    forming a high dielectric constant layer, that is greater than the low dielectric constant, on a top surface of the first spacer and on the upper part of the sidewall of the first gate electrode; and
    forming a second spacer on the upper part of the sidewall of the first gate electrode by patterning the high dielectric constant layer.

2. The method of claim 1, wherein forming the first impurity junction region is forming an elevated source/drain disposed higher than a surface of the semiconductor substrate using a selective epitaxial growth process.

3. The method of claim 2, wherein the selective epitaxial growth process provides a source material including silicon or germanium to the semiconductor substrate.

4. The method of claim 2, wherein the first spacer is formed to have a width equal to or greater than a width of the second spacer and the first and second spacers comprise separately formed unitary layers on the sidewall of the first gate electrode.

5. The method of claim 1, wherein forming the first gate electrode further comprises a capping pattern on the gate conductive pattern.

6. The method of claim 1, wherein the first spacer is formed to be disposed between the gate conductive layer and the first impurity junction region.

7. The method of claim 1, wherein the first spacer is formed of an oxide layer and the second spacer is formed of a nitride layer.

8. The method of claim 1, wherein the capping pattern is formed of a nitride layer.

9. The method of claim 1, wherein forming the first spacer comprises:
    conformally forming a preliminary spacer layer on an entire surface of a semiconductor substrate on which the first gate electrode is formed;
    anisotropically etching an entire surface of a resultant structure on which the first preliminary spacer layer is formed to form a preliminary first spacer covering the sidewall of the first gate electrode; and
    etching a portion of the preliminary first spacer using the first impurity junction region as an etching stop layer.

10. The method of claim 1, wherein forming the second spacer comprises:
    conformally forming a second spacer formation layer on an entire surface on which the impurity junction region is formed; and
    anisotropically etching an entire surface of the semiconductor substrate on which the second spacer formation layer is formed.

11. The method of claim 2, further comprising forming a second gate electrode on the semiconductor substrate, wherein the second spacer is formed to cover an entire sidewall of the second gate electrode.

12. The method of claim 2, further comprises:
    forming a second gate electrode on the semiconductor substrate; and
    forming a second impurity junction region in the semiconductor substrate of
    both sides of the second gate electrode, wherein the second impurity junction region has a top surface even with a surface of the semiconductor substrate.

13. The method of claim 1, wherein the impurity junction region is used as etch mask of the low dielectric constant layer, when the first spacer is formed by etching the low dielectric constant layer.

14. A method of manufacturing a semiconductor device comprising:
    forming a first gate electrode including a gate insulating pattern and a gate conductive pattern that are sequentially stacked on a semiconductor substrate;
    forming a low dielectric constant layer on a sidewall of the first gate electrode;
    forming a first impurity junction region on the semiconductor substrate adjacent to the sidewall of the first gate electrode;
    forming a first spacer on a lower part of the sidewall of the first gate electrode by etching the low dielectric constant layer using the first impurity junction region and the first gate electrode as an etch mask to remove a portion of the low dielectric constant layer to expose an upper part of the sidewall of the first gate electrode;
    forming a high dielectric constant layer, that is greater than the low dielectric constant, on a top surface of the first spacer and the first gate electrode and on the upper part of the sidewall of the first gate electrode; and forming a second spacer on the upper part of the sidewall of the first gate electrode by patterning the high dielectric constant layer.

* * * * *

UNITED STATES PATENT AND TRADEMARK OFFICE
CERTIFICATE OF CORRECTION

PATENT NO.        : 8,716,093 B2             Page 1 of 1
APPLICATION NO.   : 13/428900
DATED             : May 6, 2014
INVENTOR(S)       : Kim et al.

It is certified that error appears in the above-identified patent and that said Letters Patent is hereby corrected as shown below:

In the Claims:
Column 13, Claim 1, Line 43:
    Please correct "spacer on a lower sidewall of the first gate."
        to read -- spacer on a lower part of the sidewall of the first gate --

Signed and Sealed this
Eighth Day of July, 2014

Michelle K. Lee
*Deputy Director of the United States Patent and Trademark Office*